United States Patent

Green et al.

[11] Patent Number: 6,091,079
[45] Date of Patent: Jul. 18, 2000

[54] SEMICONDUCTOR WAFER

[75] Inventors: Robert Sherman Green; Larren Gene Weber, both of Boise, Id.

[73] Assignee: Micron Technology, Inc., Boise, Id.

[21] Appl. No.: 08/698,171

[22] Filed: Aug. 2, 1996

Related U.S. Application Data

[60] Continuation of application No. 08/374,343, Jan. 18, 1995, abandoned, which is a division of application No. 07/858,682, Mar. 27, 1992, Pat. No. 5,424,651.

[51] Int. Cl.$^7$ .................................................. G01R 15/12
[52] U.S. Cl. ............................................. 257/48; 324/765
[58] Field of Search ....................... 257/48, 207; 438/17; 324/765

[56] References Cited

U.S. PATENT DOCUMENTS

| | | | |
|---|---|---|---|
| 3,839,781 | 10/1974 | Russell | 29/574 |
| 3,849,872 | 11/1974 | Hubacher | 29/574 |
| 4,103,232 | 7/1978 | Sugita et al. | 324/158 |
| 4,288,911 | 9/1981 | Ports | 29/574 |
| 4,938,654 | 7/1990 | Schram | 414/757 |
| 5,003,156 | 3/1991 | Kilpatrick et al. | 219/209 |
| 5,047,711 | 9/1991 | Smith et al. | 324/158 |
| 5,059,899 | 10/1991 | Farnworth et al. | 324/158 |
| 5,138,427 | 8/1992 | Furuyama | 257/48 |
| 5,279,975 | 1/1994 | Devereaux et al. | 437/8 |
| 5,317,257 | 5/1994 | Sakai | 324/158 R |
| 5,355,081 | 10/1994 | Nakata et al. | 324/765 |
| 5,532,614 | 7/1996 | Chiu | 324/763 |

FOREIGN PATENT DOCUMENTS 55-188159 of 1982 Japan.

*Primary Examiner*—John Guay
*Attorney, Agent, or Firm*—Wells, St. John, Roberts, Gregory & Matkin, P.S.

[57] ABSTRACT

A semiconductor wafer testing fixture facilitates burn-in testing of multiple wafers, whereby individual wafers have an array of individual die or integrated circuit chips with their own test circuitry. The wafer has Vcc and Vss buses provided thereon which are coupled to the individual integrated circuit chips and test circuitry. The fixture has a housing sized to accommodate multiple semiconductor wafers in a selected orientation. The wafers are supported within the housing on corresponding shelves, which provides a back bias voltage to the wafer. The fixture has first and second conductive arms for supplying selected voltages to the Vcc and Vss buses for imparting test cycling of the integrated circuits. The first arm has multiple hands which engage the Vcc buses on the wafers supported on corresponding shelves. Likewise, the second arm has multiple second hands which engage the Vss buses on the wafers supported on corresponding shelves.

3 Claims, 8 Drawing Sheets

$F\!I\!G.\ 1$

SEMICONDUCTOR WAFER

RELATED PATENT DATA

This patent is a continuation of U.S. patent application Ser. No. 08/374,343, filed Jan. 18, 1995, now abandoned which resulted from a divisional application of U.S. patent application Ser. No. 07/858,682, filed on Mar. 27, 1992, entitled "Fixture For Burn-In Testing of Semiconductor Wafers, and a Semiconductor Wafer", listing inventors as Robert Sherman Green and Larren Gene Weber, and which is now U.S. Pat. No. 5,424,651.

TECHNICAL FIELD

This invention relates to a semiconductor wafer testing fixture for conducting burn-in test cycling of semiconductor wafers. This invention also relates to semiconductor wafers which may be subjected to such burn-in testing.

BACKGROUND OF THE INVENTION

Processed semiconductor wafers typically comprise an array of substantially isolated integrated circuitry which are individually referred to as "die". The "die" are also commonly referred to as "chips" and comprise the finished circuitry components of, for example, processors and memory circuits. Common types of memory circuitry includes DRAM and SRAM chips.

After a semiconductor wafer has been fabricated, not all chips provided on the wafer prove operable, resulting in a less than 100% yield. Accordingly, individual die must be tested for functionality. The typical test procedure for DRAM or SRAM circuitry is to first etch the upper protective passivation layer to expose desired bonding pads on the individual die. Thereafter, the wafer is subjected to test probing whereby the individual die are tested for satisfactory operation. Inoperable die are typically identified by an ink mark. After testing, the wafer is severed between the individual die, and the operable, non-marked die are collected.

The "operable" individual die are then assembled in final packages of either ceramic or plastic. After packaging, the die are loaded into burn-in boards which comprise printed circuit boards having individual sockets connected in parallel. The burn-in boards are then put into a burn-in oven and the parts are subjected to burn-in testing. During burn-in, the die are operated for a period of time at different temperature cycles, including high temperatures. The die are stressed to accelerate their lives in an effort to determine when the die are likely to fail. Manufacturers predict early failures, known as "infant mortalities", to occur within a predetermined period of time of the burn-in cycle. Burn-in testing is conducted for a period of time sufficient to reveal infant mortalities. For example, if infant mortalities are expected to occur within 48 hours of burn-in testing, the burn-in test can be completed within this time period. In this manner, semiconductor wafer manufacturers can effectively test the quality of their chips in a reasonable time frame prior to shipping these chips to the consumer.

According to the above burn-in testing procedures, the die are subjected to a test before severing, and a second test after severing and packaging of the individual die. Therefore, two separate tests are required.

U.S. Pat. No. 5,047,711 to Smith et al. discloses a technique whereby individual circuits are subjected to burn-in testing while still constituting a part of a wafer which has not yet been severed. It would be desirable to improve upon these and other techniques for fabricating wafers and testing individual die prior to their severing from the semiconductor wafer.

BRIEF DESCRIPTION OF THE DRAWINGS

Preferred embodiments of the invention are described below with reference to the following accompanying drawings.

FIG. 6 shows conductive arms of the wafer testing fixture in their down position.

DETAILED DESCRIPTION OF THE PREFERRED EMBODIMENTS

Figure 1:
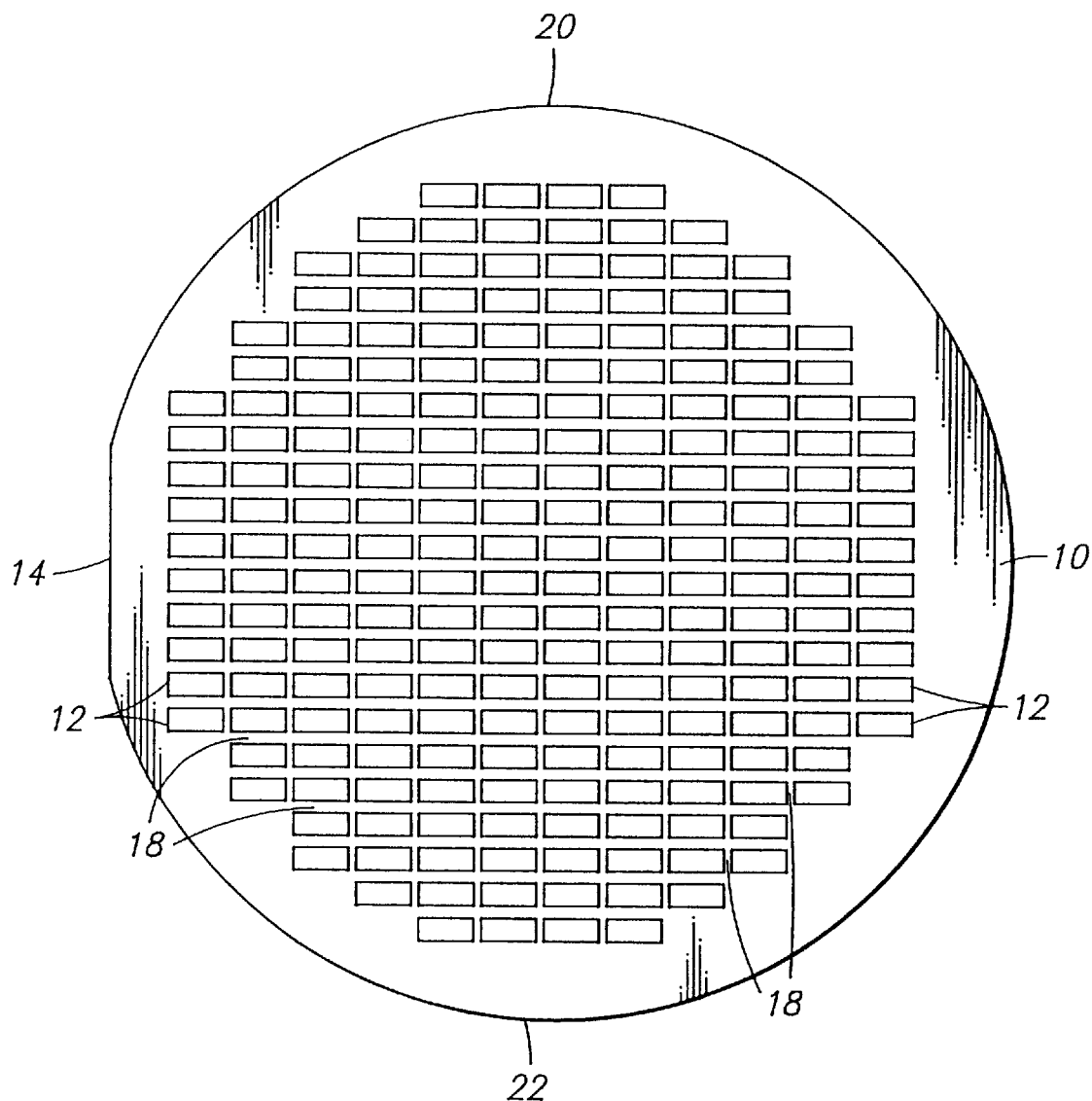
FIG. 1 is a diagrammatic top plan view of a semiconductor wafer having an array of die.

This disclosure of the invention is submitted in furtherance of the constitutional purposes of the U.S. Patent Laws "to promote the progress of science and useful arts" (Article 1, Section 8).

In accordance with one aspect of the invention, a semiconductor wafer testing fixture for conducting burn-in test cycling of a semiconductor wafer comprises:

a housing sized to receive and register a semiconductor wafer in a selected orientation;

a shelf provided in the housing for supporting the wafer within the housing, the shelf comprising back biasing means for supplying a back bias voltage to the wafer; and first and second conductive arms for supplying selected voltages to corresponding ones of Vcc and Vss buses on the wafer for imparting test cycling of integrated circuits on the wafer, the first arm having a first hand extending angularly therefrom above the shelf in the housing for engaging the Vcc bus on the wafer, the second arm having a second hand extending angularly therefrom above the shelf in the housing for engaging the Vss bus on the wafer.

Preferably, the housing has openings formed therein above the shelf and the first and second arms are located outside of the housing with the first and second hands extending through the openings into the housing. Additionally, the first and second hands are preferably crescent shaped and engage peripheral edges of the semiconductor wafer.

In accordance with another aspect of the invention, a semiconductor wafer testing fixture for conducting burn-in test cycling of multiple semiconductor wafers comprises:

a housing sized to receive and register a plurality of semiconductor wafers in selected orientations along an axis;

a plurality of shelves provided at spaced distances in the housing for supporting individual semiconductor wafers within the housing, the shelves comprising back biasing means for supplying a back bias voltage to the wafers supported on the shelves;

first and second conductive arms positioned on opposing sides of the housing for supplying selected voltages to corresponding ones of Vcc and Vss buses on the wafer for imparting test cycling of integrated circuits on the wafer upon application of the selected voltages;

the first arm comprising:

multiple first hands aligned at selected distances along the first arm corresponding to the spaced distances of the shelves in the housing and projecting radially inward from the first arm toward the axis so that individual first hands are provided for corresponding individual shelves, the first hands engaging the Vcc buses on the wafers supported on the corresponding shelves; and the second arm comprising:

multiple second hands aligned at selected distances along the second arm corresponding to the spaced distances of the shelves in the housing and projecting radially inward from the second arm toward the axis so that individual second hands are provided for corresponding individual shelves, the second hands engaging the Vss buses on the wafers supported on the corresponding shelves.

In accordance with still another aspect of the invention, a semiconductor wafer comprises:

a plurality of individual die containing integrated circuits arrayed for singulation from the wafer, the die being arrayed between opposing first and second peripheral edges of the wafer;

test cycling circuitry for test cycling individual die;

a passivation layer;

Vcc and Vss pads associated with individual die;

electrical contacts extending through the passivation layer to the Vcc and Vss pads;

Vcc buses provided atop the passivation layer which electrically connect with the Vcc pads and test circuitry, the Vcc buses being connected to a common Vcc region at the first peripheral edge of the wafer; and Vss buses provided atop the passivation layer which electrically connect with the Vss pads, the Vss buses being connected to a common Vss region at the second peripheral edge of the wafer, the Vss region being electrically insulated from the Vcc region.

FIG. 1 illustrates a semiconductor wafer 10 having an array of integrated circuit die 12 designed for singulation from the wafer. Wafer 10 is p-type and substantially circular, having one flat side 14 for purposes of registration and orientation during processing and testing. The die 12 are arranged between opposing first and second peripheral edges 20 and 22 of wafer 10. Wafer 10 includes areas 18 between individual die 12 which define scribe line areas through which the wafer will be severed to produce singulated die 12.

Die test cycling circuitry is provided on wafer 10 for testing cycling individual die. Preferably, individual test cycling circuitry is associated with each of the individual die. As one example, the individual test cycling circuitry could be positioned within the scribe line area 18. Example techniques for incorporating circuitry within scribe line area is described in our U.S. Pat. No. 5,059,899. Alternately, and as is described with reference to the preferred embodiment of the drawings, the individual test cycling circuitry is provided on each of the individual die. Example test cycling circuitry is shown by way of example in our U.S. Pat. No. 5,279,975, entitled "Method of Testing Individual Dies On Semiconductor Wafers Prior to Singulation", which issued on Jan. 18, 1994 and is hereby incorporated by reference.

Figure 2:
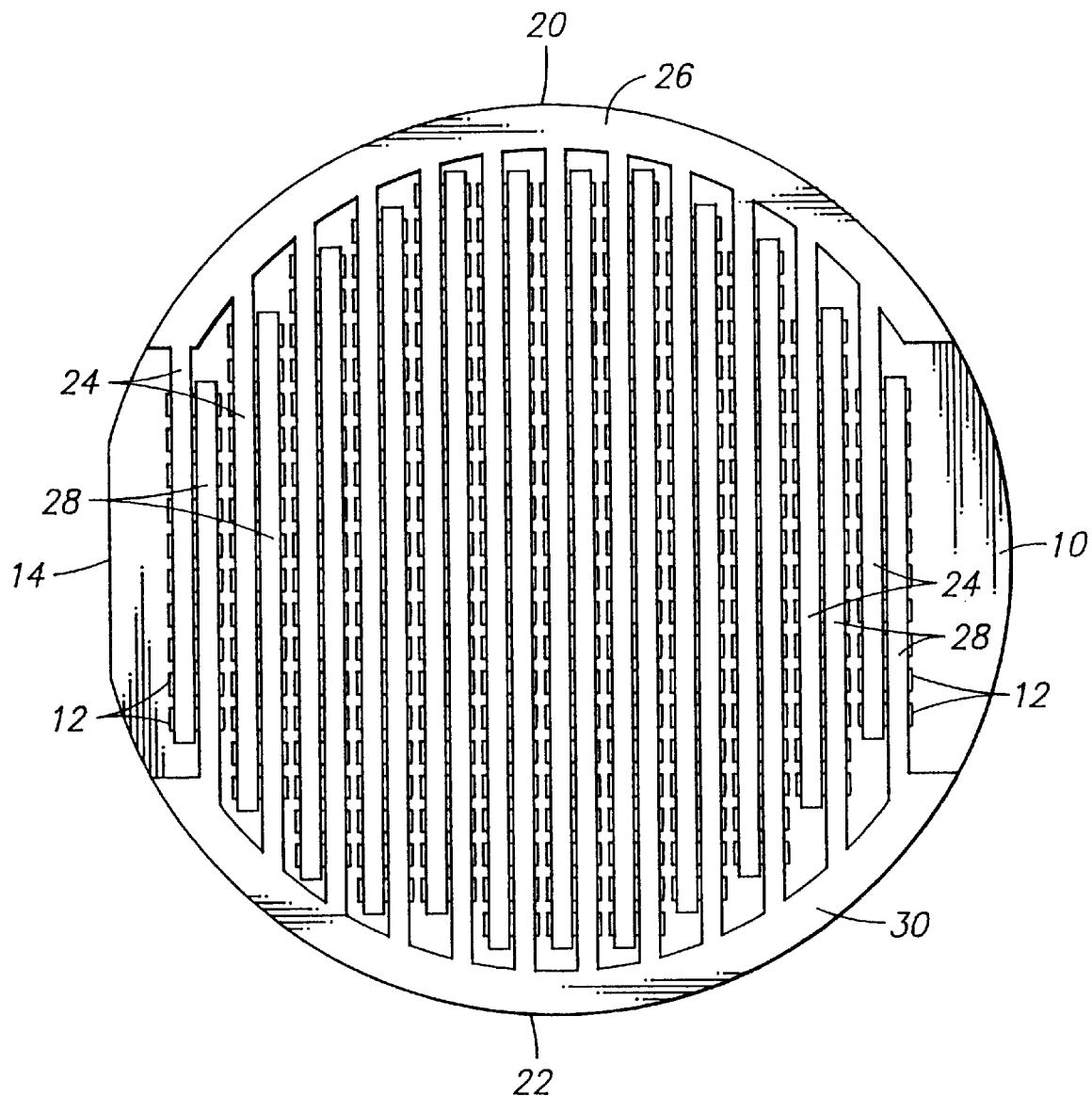
FIG. 2 is a diagrammatic top plan view of a semiconductor wafer constructed in accordance with an aspect of the present invention.

FIG. 2 shows semiconductor wafer 10 having conductive Vcc buses 24 and conductive Vss buses 28 formed atop of the individual die 12 between peripheral edges 20 and 22. Vcc buses 24 are connected to a common Vcc region 26 at first peripheral edge 20 of wafer 10. Similarly, Vss buses 28 are connected to a common Vss region 30 at the second peripheral edge 22 of wafer 10. Preferably, Vcc buses 24 and Vss buses 28 are arranged over wafer 10 in a substantially parallel and alternating manner, as shown in FIG. 2. Vcc region 26 and Vss region 30 are preferably crescent shaped (as shown) along respective first and second peripheral edges 20, 22 of wafer 10. Vcc buses 28 and Vcc region 26 are electrically insulated from Vss buses 28 and Vss region 30. Individual die 12 are electrically coupled to both a Vcc bus 24 and a Vss bus 28.

Figure 3:
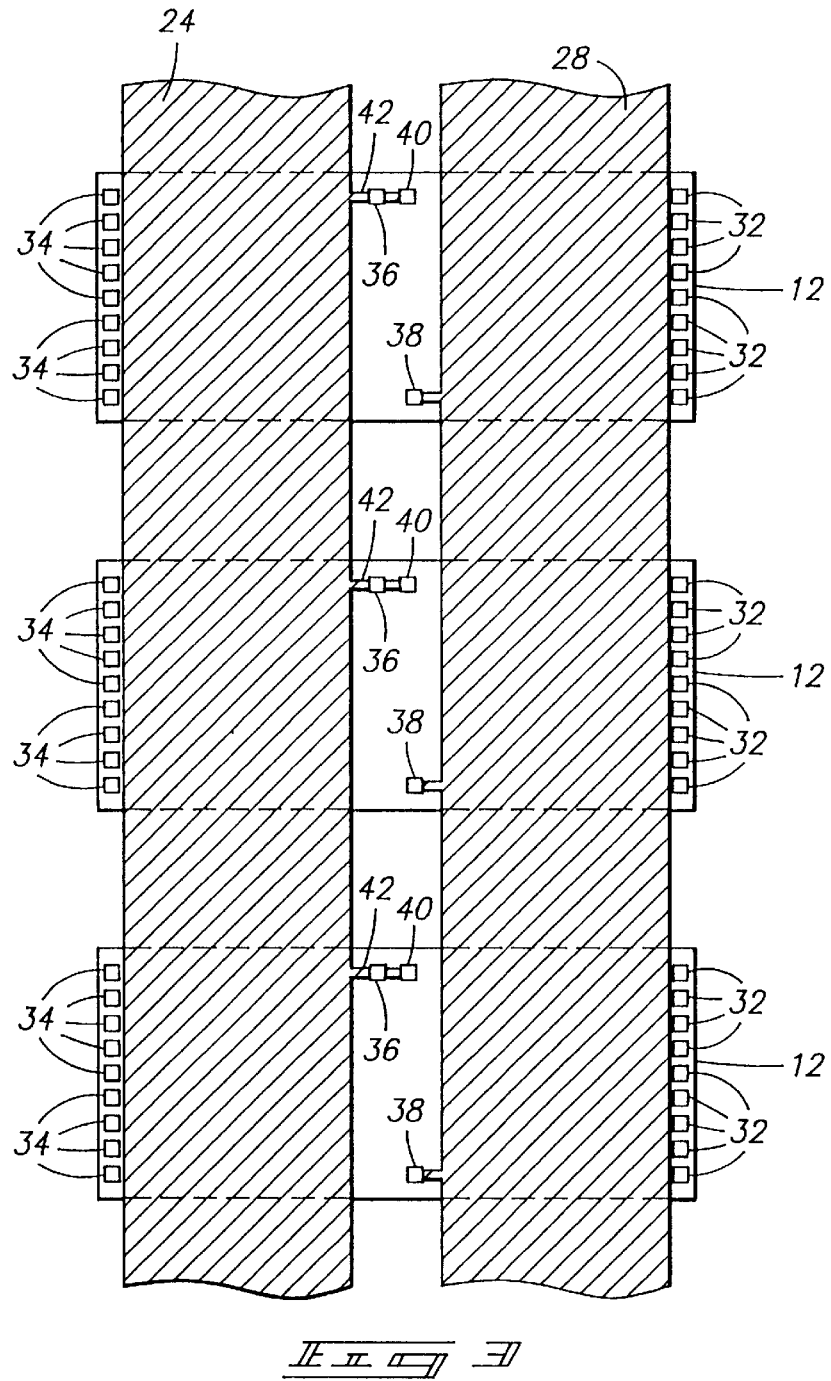
FIG. 3 is an enlarged top plan view of a portion of the FIG. 2 wafer, illustrating three adjacent die from the wafer.

FIG. 3 shows a series of three adjacent die 12 beneath conductive Vcc and Vss buses 24 and 28. Die 12 each comprise a series of bonding pads 32 and 34 with enlarged electrical connections which extend to the microscopic integrated circuitry formed within each of die 12. The bonding pads are used for interconnecting the circuitry of die 12 during testing. In final operation, bonding pads 32 and 34 will interconnect die 12 to components on a larger printed circuit board, commonly through a finished package having pins. Typically, one of pads 32, 34 will comprise a Vcc pad which will provide a desired operating voltage to the chip, such as 5 volts, to power the circuit operation. As well, one of pads 32, 34 will comprise a Vss pad for connecting the specific chip to a lower voltage, such as ground, for completing the circuit.

Wafer 10 is typically provided with a passivation layer (not shown in the drawings) which covers the entire top surface of the wafer. The passivation layer insulates and protects the die from mechanical and chemical damage during assembly and packaging and during its life time. Ultimately, contact openings are etched through the passivation layer to expose the various bonding pads 32, 34 for testing and ultimate operation of operable die.

Individual die 12 of wafer 10 are illustrated as having been patterned to provide a secondary or sacrificial Vcc pad 36 and secondary or sacrificial Vss pad 38. Sacrificial Vcc pad 36 and sacrificial Vss pad 38 are connected by circuitry on the die to the permanent Vcc pad and Vss pad of peripheral pads 32, 34. Additionally, die 12 have a cycling test pad 40 which is electrically coupled to test cycling circuitry (not shown) associated with each die. The test circuitry is preferably designed to repeatedly cycle the chip instantly upon application of Vcc voltage. Pads 36, 38, and 40 are shown for illustration purposes to the sides of buses 24 and 28. However, these pads may be located in other areas of the wafer, such as beneath their respective buses 24 and 28. Additionally, the Vcc, Vss, and test pads for purposes of bus construction could be provided within the scribe line area 18 (FIG. 1) and interconnected in parallel with the desired circuitry on the individual chips.

Figure 11:
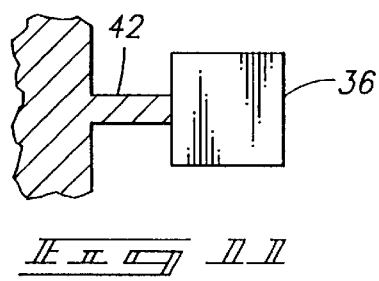
FIG. 11 is an enlarged diagrammatic top plan view of a fuse employed to test cycle the die shown in FIG. 3.

In accordance with the preferred aspects of the invention, the passivation layer is patterned to expose pads 36, 38, and 40 associated with each die 12. Thereafter, a layer of conductive material, preferably metal, is applied atop the wafer. The conductive layer is then patterned to provide a series of Vcc buses 24 and Vss buses 28, as illustrated in FIGS. 2 and 3. Vcc bus 24 connects with the sacrificial Vcc pads 36 and test cycling pads 40. In this manner, the Vcc bus electrically connects with both the test cycling circuitry and the Vcc circuitry on the individual die. Similarly, Vss bus 22 connects with sacrificial Vss pads 38. Additionally, the conductive layer is patterned to provide fuses 42 between Vcc bus 24 and individual Vcc sacrificial pads 36. FIG. 11 shows an enlarged view of fuses 42. The purpose of fuses 42 is described below in more detail.

Burn-in testing of the wafer is typically conducted in a furnace. Burn-in testing purposefully stresses the circuitry provided on each die to discover potential defects. Burn-in testing, which preferably includes applying various temperatures and voltages to the die, effectively accelerates the life of the circuitry on the die to determine when the circuitry fails. During burn-in testing, the desired selected voltages are applied to Vcc bus 24 and Vss bus 28. The desired Vcc voltage would also be provided to test pads 36, thus causing the individual die to be cycled during burn-in testing. Fuses 42 are associated with each die in the event current in any one chip would become too high as the result of a failed design within the individual chip. For example, if there was a Vcc to Vss short or a latch-up in an individual chip, current flow to individual chips could reach one amp. Such excessive current might damage or destroy the bus or wafer and associated die. Accordingly, fuses 42 would be constructed to blow at some predetermined current value to prevent such high current flows. For example, in FIG. 11, fuse 42 has a width of approximately one-fourth of the width of pad 36 which will blow at one predetermined current value. Different width fuses would blow at different current values.

Upon completion of the burn-in test, Vcc bus 24 and Vss bus 28 are etched from the wafer. Any over-etching of the Vcc and Vss buses is of no concern because pads 36, 38 and 40 are sacrificial, and the underlying circuitry is protected by oxide.

At this point in the process, wafer 10 is patterned and etched to provide contact openings through the passivation layer to expose all conductive bonding pads 32, 34 necessary for ultimate bonding and testing of the wafer. The entire wafer is then subjected to a single testing for operability of individual die by engaging selective conductive pads 32, 34 with testing equipment. Operable and inoperable die are thereafter identified, such as marking the inoperable die and leaving the operable die without marks. The wafer is then severed and the operable die are collected.

Note that such techniques enable the wafer to be subjected to a single test which would determine operable die. The test is conducted on all of the chips while they are in complete wafer form, as opposed to a test that is conducted on the chips after singulation.

FIGS. 4–7 show a semiconductor wafer testing fixture 50 for conducting burn-in test cycling of multiple semiconductor wafers. Fixture 50 has a housing 52 which is sized to receive and register multiple semiconductor wafers 10 in a selected orientation along an axis 76. Housing 52 simultaneously supports five semiconductor wafers in parallel. Housing 52 may be designed to support more or less than five wafers without departing from the spirit of this invention. The number of wafers feasible for simultaneous burn-in testing is primarily dependent upon the current requirements necessary to simultaneously test cycle multiple die on multiple wafers. Housing 52 has opposing side walls 54 and 56 (FIGS. 4, 6, and 7) which are preferably parallel to one another. Wall 54 has a vertical array of openings 58–62 and wall 56 has a vertical array of openings 64–68. Fixture 50 has an open side (referenced generally by numeral 78) in the housing with sufficient width to allow semiconductor wafers 10 to be inserted and withdrawn from the housing.

Figure 6:
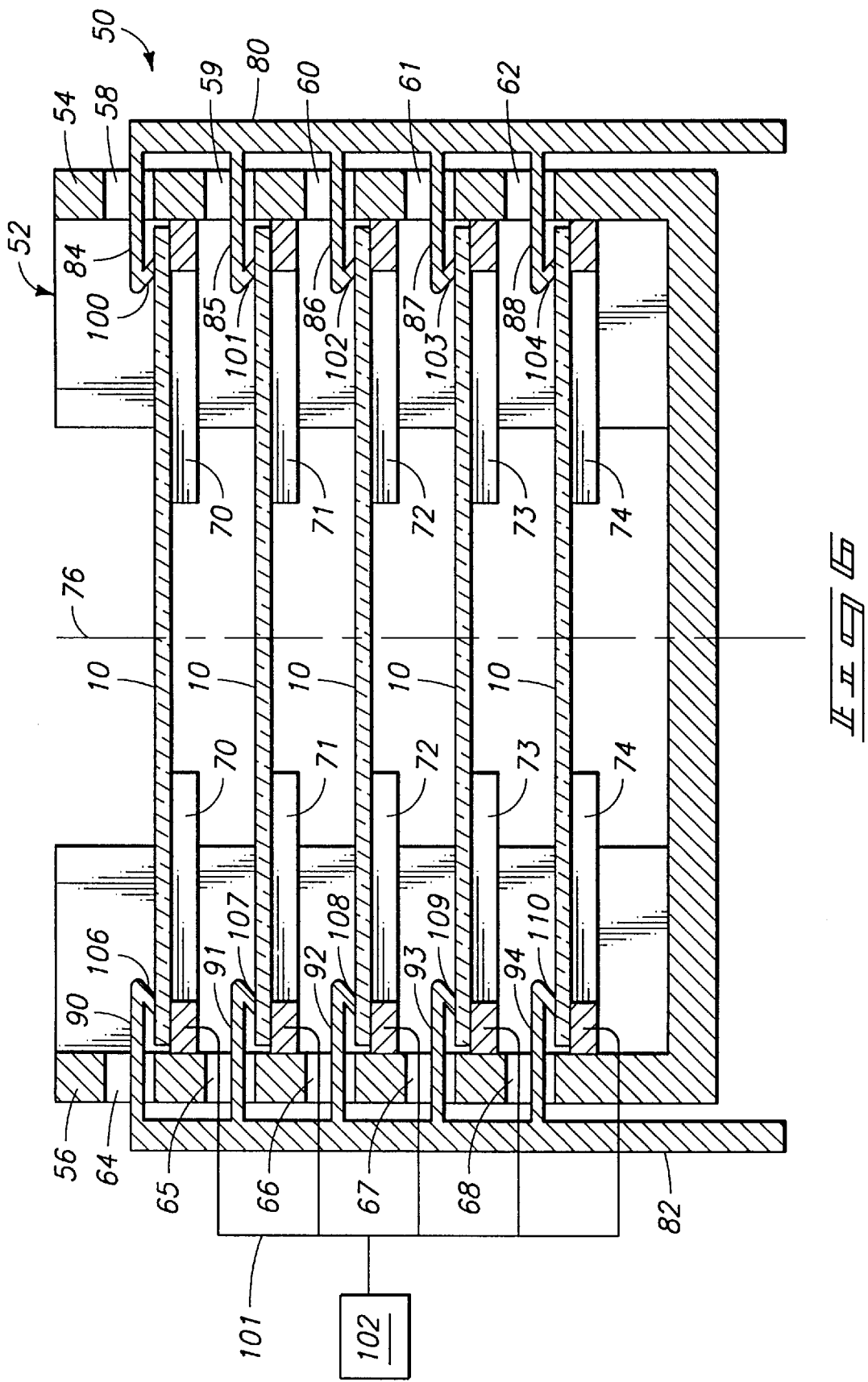
FIG. 6 is a sectional taken along line 6—6 in FIG. 4.
Figure 7:
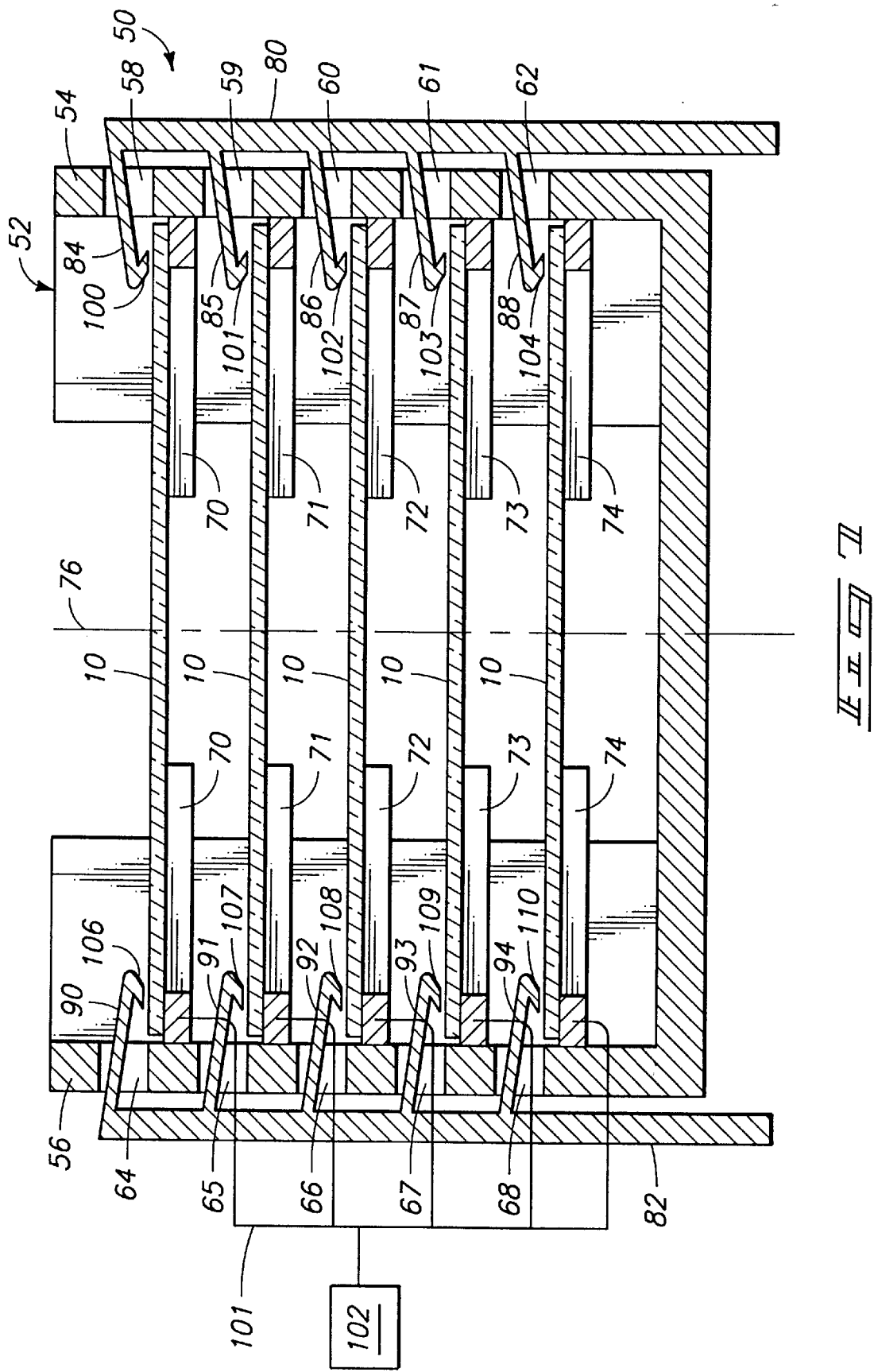
FIG. 7 is a sectional taken along a line similar to line 6—6 in FIG. 4 illustrating the conductive arms of the wafer testing fixture in their up position.

Fixture 50 has multiple shelves 70–74 provided at spaced distances in housing 52 for supporting corresponding individual semiconductor wafers 10 within the housing. Shelves 70–74 are connected to, or integrally formed with, housing 52 and extend inward from the walls of the housing toward axis 76. Shelves 70–74 have a width sufficient to support wafers 10 along their edges as shown in FIGS. 6 and 7. Shelves 70–74 are positioned in housing 52 beneath corresponding and opposing openings 58–62 and 64–68. Shelves 70–74 include a back biasing means for supplying a back bias voltage to wafers 10. Such back biasing means may be, for example, a conductor 101 and voltage source 102 (DC) connected to shelves 70–74 for supplying a sufficient back bias voltage to wafers 10.

Fixture 50 also includes a first conductive arm 80 and a second conductive arm 82 for supplying selected voltages to the semiconductor wafers supported within housing 52. First arm 80 is electrically coupled to a Vcc power supply, such as five volts, and second arm 82 is electrically coupled to a Vss power supply, such as ground. In this manner, first conductive arm 80 supplies a Vcc voltage to Vcc buses 24 (and ultimately, die 12) and second conductive arm 82 supplies a Vss voltage to Vss buses 28. Arms 80, 82 supply the voltages to power the test cycling circuitry on the integrated circuits of individual die 12 provided in wafer 10 during the burn-in testing. First and second arms 80, 82 are provided on opposing sides of housing 52 and are preferably aligned substantially parallel to axis 76. Arms 80 and 82 may be vertically raised and lowered within openings 58–62 and 64–68 between a down position (diagrammatically shown in FIG. 6) and an up position (diagrammatically shown in FIG. 7).

First arm 80 has multiple first hands 84–88 which extend at an angle (slightly less than 90° in an unstressed state shown in FIG. 7) from arm 80 inward toward axis 76 above corresponding shelves 70–74. Similarly, arm 82 has multiple hands 90–94 which extend angularly (slightly less than 90° in an unstressed state shown in FIG. 7) from arm 82 inward toward axis 76 and above corresponding shelves 70–74. First hands 84–88 and second hands 90–94 are aligned at selected distances along respective first arm 80 and second arm 82 corresponding to the space distances of shelves 70–72. In this manner, a set of one first hand and one second hand are provided for each corresponding individual shelf. For instance, a set of first hand 84 and second hand 90 is provided for shelf 70 to engage respective Vcc and Vss buses on wafer 10 supported atop shelf 70.

Preferably, arms 80, 82 are located outside of housing 52 and hands 84–88, 90–94 extend radially inward toward axis 76 into the housing through corresponding openings. Specifically, hands 84–88 extend inward from arm 80 through corresponding openings 58–62 and hands 90–94 extend inward from arm 82 through corresponding openings 64–68.

When arms 80 and 82 are in their up position (FIG. 7), up to five wafers may be inserted into housing 52 onto shelves 70–74. In this up position, first and second hands 80–88 and 90–94 are preferably mechanically biased downward from their respective openings 58–62 and 64–68 toward wafers 10 supported on shelves 70–74 as shown. The mechanical biasing may be created by the downward slant of the hands extending from the arms. Alternately, the mechanical bias may be achieved with additional biasing means, such as springs or other resilient materials. First and second arms 80 and 82 can then be pulled downward to their down position such that first hands 84–88 and second hands 90–94 are pressed against wafers 10 to engage and hold the wafers 10 onto shelves 70–74 as shown in FIG. 6. As a result, five semiconductor wafers 10 may be simultaneously subjected to burn-in testing using fixture 50.

Figure 4:
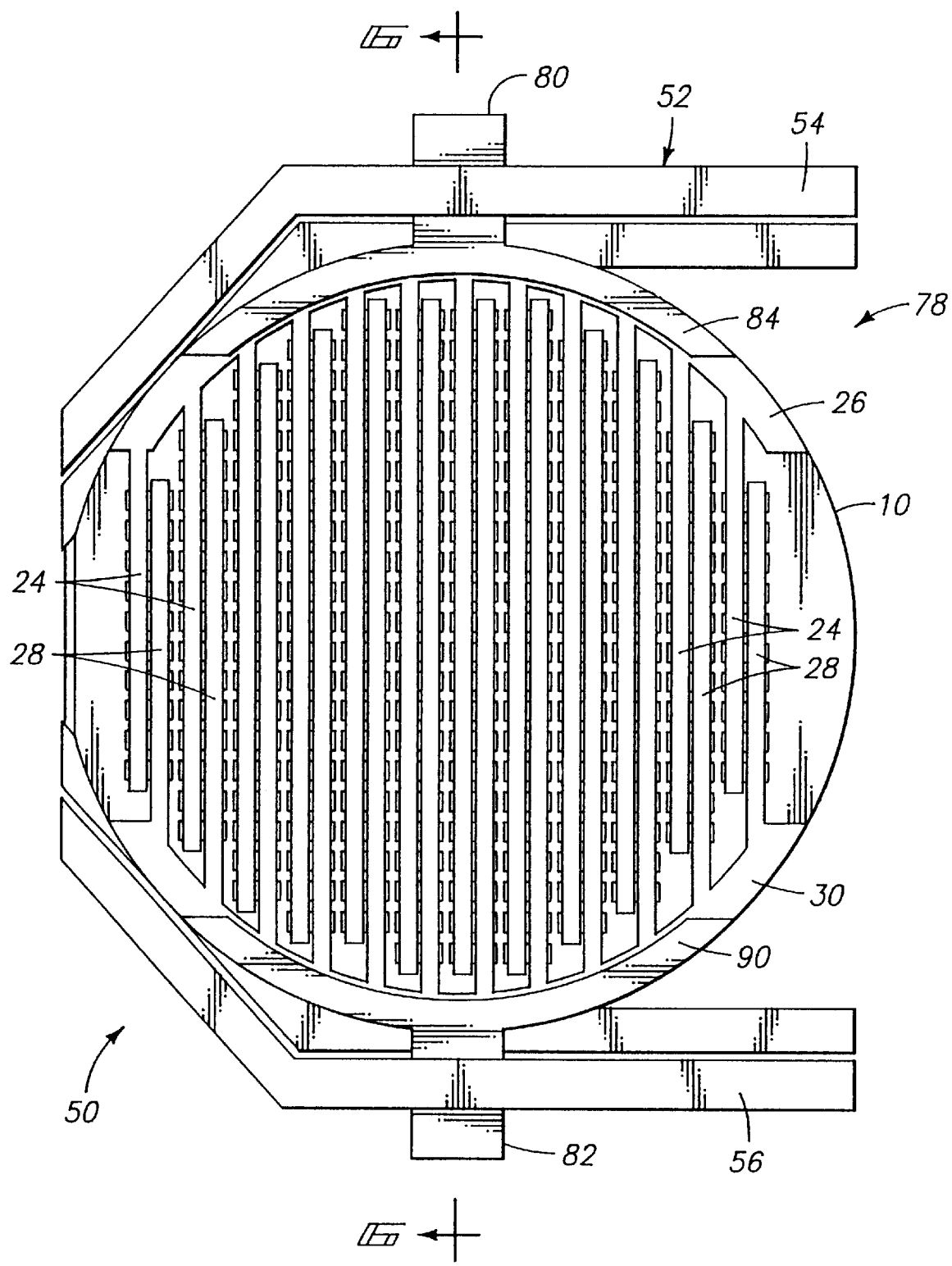
FIG. 4 is a diagrammatic top plan view of a semiconductor wafer testing fixture according to the present invention.
Figure 5:
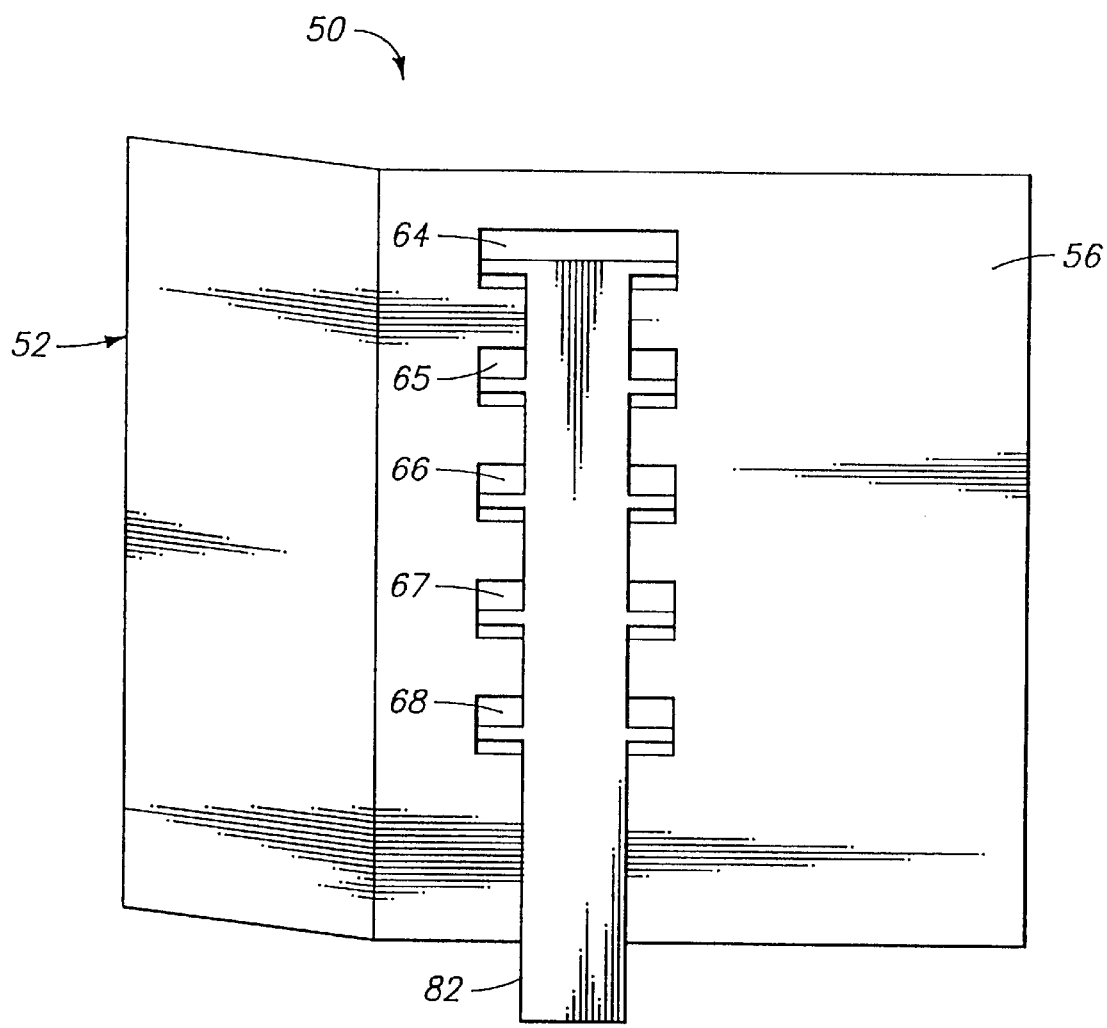
FIG. 5 is a diagrammatic side elevation view of the semiconductor wafer testing fixture shown in FIG. 4.

Individual hands of first hands 84–88 and second hands 90–94 are preferably crescent shaped to engage peripheral edges of the semiconductor wafer 10 as shown in FIG. 4. In this manner, the crescent shaped hands may engage the crescent shaped Vcc and Vss regions 26, 30 of the semiconductor wafer 10 to impart sufficient voltages for test cycling the integrated circuitry in individual die 12 during burn-in testing. Of course, the first and second hands may be designed in other shapes—such as circular, elliptical, rectangular, or polygonal with a concave side—without departing from the scope of this invention.

In accordance with a preferred aspect of the invention, individual hands 84–88 comprise at least one finger (referenced in FIGS. 6 and 7 by numerals 100–104 for corresponding hands 84–88) projecting at an angle therefrom. Similarly, individual second hands 90–94 include at least one finger (referenced by numerals 106–110 for corresponding hands 90–94) projecting at an angle therefrom. The fingers 100–104 and 106–110 engage the peripheral edges of wafer 10 to provide an electrical contact between conductive arms 80, 82 and the Vcc and Vss regions 26, 30 of the semiconductor wafer 10.

Figure 8:
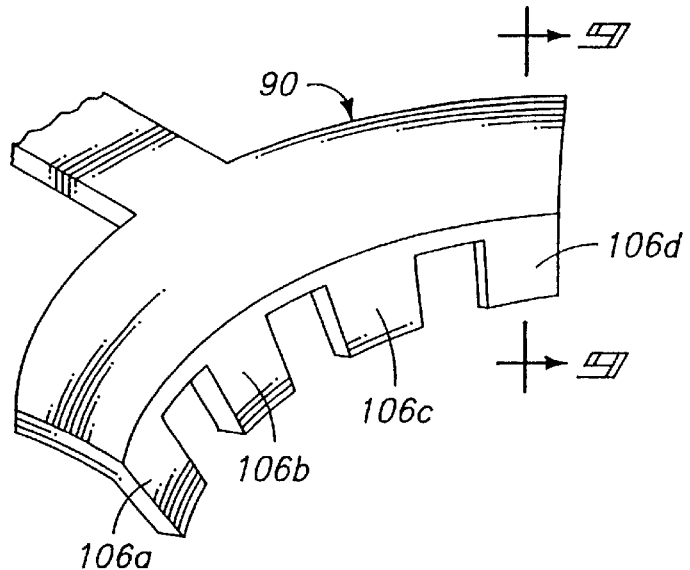
FIG. 8 is a perspective view of hand and finger components of the wafer testing fixture of FIG. 4.

FIG. 8 shows a diagrammatic perspective view of hand 90. Hand 90 is crescent shaped and includes multiple fingers 106a–106d which extend at an angle from hand 90. Fingers 106a–106d are preferably mechanically biased toward the semiconductor wafers 10 supported atop shelves 70–74. This mechanical biasing of both the hands and the fingers facilitate good electrical contact for imparting test voltages to the Vcc and Vss buses atop semiconductor wafers 10. Although only four fingers are shown in FIG. 8, more or less fingers may be used as desired to effectuate the best electrical contact between the fingers and Vcc and Vss regions 26, 30. Good electrical contact is important because large currents are typically being supplied to the wafers to test cycle multiple die simultaneously.

Figure 9:
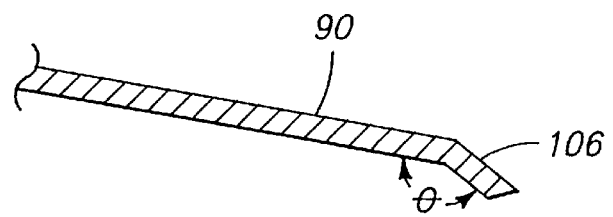
FIG. 9 is a cross sectional view taken along line 9—9 in FIG. 8 of one embodiment of a hand and finger component of the present invention illustrating an angled position of the finger with respect to the hand.
Figure 10:
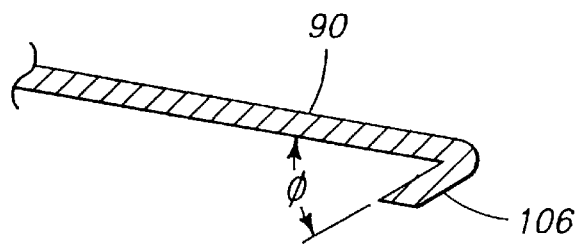
FIG. 10 is a cross sectional view of a hand and finger component illustrating an alternative angled position of the finger with respect to the hand.

As shown in FIGS. 9 and 10, fingers 106 may be angled from hand 90 in two general ways. In FIG. 9, finger 106 extends at an obtuse angle θ from hand 90. In FIG. 10, finger 106 extends at an acute φ from hand 90. Either type of angle provide a mechanical bias sufficient to enhance an electrical contact between the wafer and the fingers.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor wafer comprising:
   a plurality of individual die containing integrated circuitry arrayed for singulation from the wafer, the die being arrayed between opposing first and second peripheral edges of the wafer;

test cycling circuitry for test cycling individual die;

cycling test, Vcc and Vss pads associated with individual die, the test cycling circuitry being electrically coupled to the cycling test pads, the cycling test pads being spaced from the Vcc pads;

Vcc buses provided elevationally outward of the individual die, individual Vcc buses comprising an elongated major portion and a plurality of minor portions, a Vcc bus minor portion extending generally laterally from said Vcc bus major portion and electrically connecting with a Vcc pad and a cycling test pad of an individual die, the Vcc buses being connected to a common Vcc region at the first peripheral edge of the wafer;

Vss buses provided elevationally outward of the individual die, individual Vss buses comprising an elongated major portion and a plurality of minor portions, at least some of said Vss bus minor portions extending generally laterally from said Vss bus major portion and electrically connecting with a Vss pad of an individual die, the Vss buses being connected to a common Vss region at the second peripheral edge of the wafer, the Vss region being electrically insulated from the Vcc region;

both of the common Vcc region and the common Vss region having a respective peripherally outermost edge which is flush against the respective first or second wafer peripheral edge; and at least one of the Vcc buses and at least one of the Vss buses having their respective elongated major portion overlying at least in part a plurality of common individual die.

2. The semiconductor wafer of claim 1 wherein the Vcc minor portions and the Vss minor portions overlie individual die and not wafer area between individual die.

3. A semiconductor wafer comprising:
   a plurality of individual die containing integrated circuitry arrayed for singulation from the wafer, the die being arrayed between opposing first and second peripheral edges of the wafer;

test cycling circuitry for test cycling individual die;

cycling test, Vcc and Vss pads associated with individual die, the test cycling circuitry being electrically coupled to the cycling test pads, the cycling test pads being spaced from the Vcc pads;

Vcc buses provided elevationally outward of the individual die, individual Vcc buses comprising an elongated major portion and a plurality of minor portions, a Vcc bus minor portion extending generally laterally from said Vcc bus major portion and electrically connecting with a Vcc pad and a cycling test pad of an individual die, the Vcc buses being connected to a common Vcc region at the first peripheral edge of the wafer;

Vss buses provided elevationally outward of the individual die, individual Vss buses comprising an elongated major portion and a plurality of minor portions, at least some of said Vss bus minor portions extending generally laterally from said Vss bus major portion and electrically connecting with a Vss pad of an individual die, the Vss buses being connected to a common Vss region at the second peripheral edge of the wafer, the Vss region being electrically insulated from the Vcc region; and both of the common Vcc region and the common Vss region having a respective peripherally outermost edge which is flush against the respective first or second wafer peripheral edge.

* * * * *